United States Patent [19]

Nowak et al.

[11] Patent Number: 5,700,717

[45] Date of Patent: Dec. 23, 1997

[54] METHOD OF REDUCING CONTACT RESISTANCE FOR SEMICONDUCTOR MANUFACTURING PROCESSES USING TUNGSTEN PLUGS

[75] Inventors: Edward D. Nowak; Ying-Tsong Loh, both of Pleasanton; Lily Ding, Fremont, all of Calif.

[73] Assignee: VLSI Technology, Inc., San Jose, Calif.

[21] Appl. No.: 557,659

[22] Filed: Nov. 13, 1995

[51] Int. Cl.$^6$ .................................................... A01L 21/28
[52] U.S. Cl. ............................................ 437/192; 190/24
[58] Field of Search ........................... 437/24, 190, 192, 437/48

[56] References Cited

U.S. PATENT DOCUMENTS

| | | | |
|---|---|---|---|
| 4,683,645 | 8/1987 | Naguib et al. | 437/24 |
| 5,360,766 | 11/1994 | Ko et al. | 437/192 |
| 5,470,794 | 11/1995 | Anjum et al. | 437/200 |
| 5,580,823 | 12/1996 | Hedge et al. | 437/192 |
| 5,593,923 | 1/1997 | Horiuchi et al. | 437/200 |
| 5,620,926 | 4/1997 | Itoh | 437/192 |

FOREIGN PATENT DOCUMENTS

| | | |
|---|---|---|
| 2-210833 | 8/1990 | Japan . |
| 6-140358 | 5/1994 | Japan . |

OTHER PUBLICATIONS

"Species, Dose and Energy Dependence of Implant Induced Transient Enhanced Diffusion"; P.B. Griffin et al.; IEDM Tech. Dig 1993; pp. 295–298.

"Explanantion of Reverse Short Channel Effect by Defect Gradients"; C.S. Rafferty et al.; IEDM Tech. Dig 1993; pp. 311–314.

"Enhanced Short–Channel Effects in NMOSFETs Due to Boron Redistribution Induced By Arsenic Source and Drain Implant"; D.K. Sadana et al.; IEDM Tech. Dig 1993; pp. 849–852.

*Primary Examiner*—John Niebling
*Assistant Examiner*—Thomas G. Bilodeau
*Attorney, Agent, or Firm*—Gary S. Williams; Flehr Hohbach Test Albritton & Herbert LLP

[57] ABSTRACT

A system and method for reducing the contact resistance associated with tungsten plug contacts to P-doped diffusion regions of a semiconductor device. Before or during the formation of the tungsten plug contacts, a high energy, low dosage of an N-dopant or neutral species such as silicon or germanium is implanted into the P-doped diffusion regions of the semiconductor device. The implantation causes lattice damage within the P-doped diffusion regions, enhancing diffusion of the P-dopant within the P-doped diffusion regions. This results in the P-dopant diffusing toward the contact, replacing dopant lost to segregation into the contact metalization, and thus reducing the contact resistance.

22 Claims, 3 Drawing Sheets

METHOD OF REDUCING CONTACT RESISTANCE FOR SEMICONDUCTOR MANUFACTURING PROCESSES USING TUNGSTEN PLUGS

The present invention relates generally to semiconductor manufacturing techniques for manufacturing semiconductor devices with submicron sized features, and particularly to a system and method for reducing the contact resistance associated with tungsten plug contacts to P-doped diffusion regions.

BACKGROUND OF THE INVENTION

As semiconductor device dimensions continue to shrink into the "deep submicron" regime, maintaining low resistance contacts to diffused regions is becoming more difficult. Deep submicron processes for fabrication of MOS transistors require very shallow source and drain junctions to suppress short channel effects and also require more complex metalization systems for ultra-high levels of integration.

Referring to FIG. 1, the through-the-contact metalization required for a typical diffused contact 50 is comprised of a contact layer 53 such as the silicide $TiSi_2$ (to enhance binding between the silicon and the subsequent metalization and to form an ohmic contact), a barrier metal 54 such as TiN (a barrier to silicon diffusion), and a plug 56 such as tungsten. One problem with this metal scheme is that boron is drawn (segregates) from P-doped diffusion region 59 into the $TiSi_2$ and TiN portions of the contact. This locally depletes the contact regions of boron, resulting in either a high contact resistance or, in the worst case, a rectifying contact.

It is an object of the present invention to modify conventional tungsten plug contact formation methodologies to counteract the boron segregation problem discussed above and to thereby reduce the resistance associated with such contacts.

SUMMARY OF THE INVENTION

The present invention is a system and method for reducing the contact resistance associated with tungsten plug contacts to P-doped diffusion regions of a semiconductor device. The invention involves implanting a high energy, low dosage of an N-dopant or an electrically neutral material, such as silicon or germanium, into the P-doped diffusion regions before or during the formation of the tungsten plug contacts. No masking of the device is required for the implantation. The implant causes lattice damage within the diffusion regions such that the diffusion of the P-dopant within the diffusion regions is enhanced. This results in the P-dopant diffusing toward the contact and thus reducing the contact resistance.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
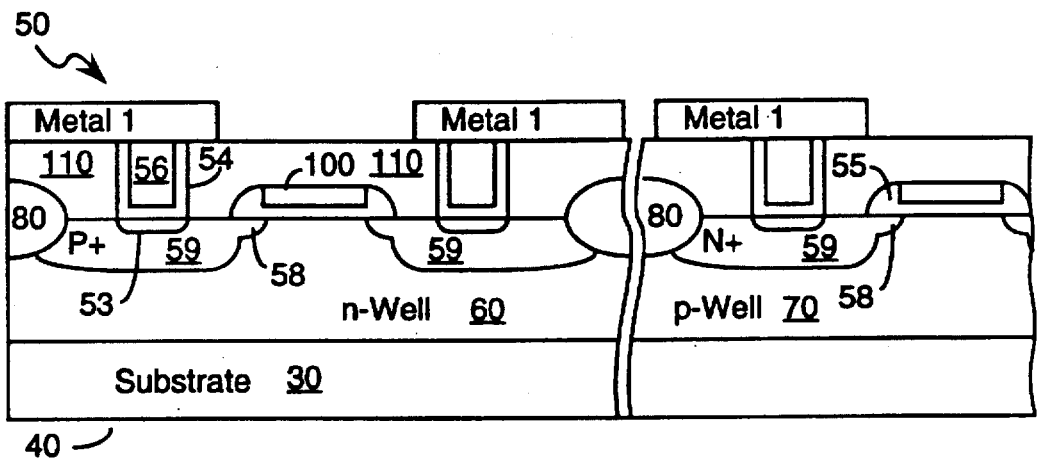
FIG. 1 depicts a cross section view of a CMOS structure including a prior art tungsten plug contact.

Referring to FIG. 1, there is shown a cross section view of a CMOS structure 40, including a prior art tungsten plug contact 50. Contact 50 includes a contact layer 53 such as the silicide $TiSi_2$ (to enhance binding between the silicon substrate and the subsequent metalization and to form an ohmic contact), a barrier metal 54 such as TiN (to prevent silicon diffusion into the metalization), and a plug 56 such as tungsten. Contact 50 is coupled to P-doped diffusion regions 58 and 59, which form the source and drain of an MOS transistor. Diffusion regions 58 and 59, which are doped with a p-type material such as boron, are comprised of lightly doped P region ("LDD") 58 and more heavily doped P+ region 59.

Figure 2A:
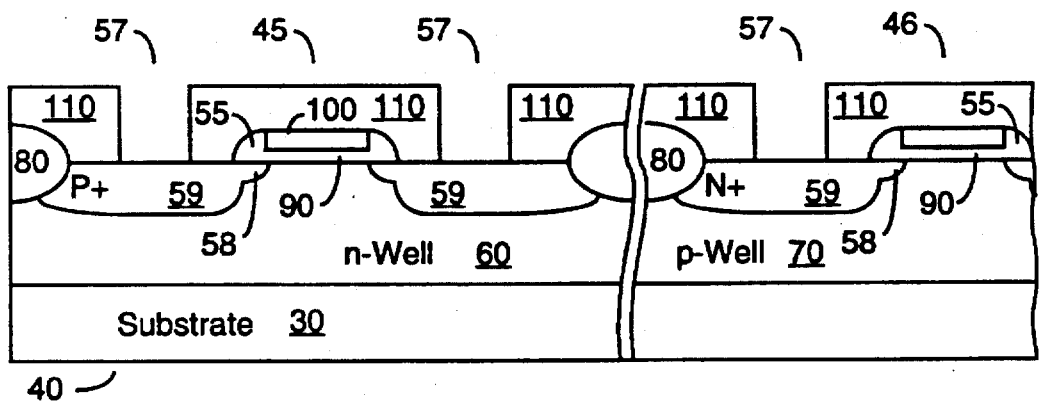
FIGS. 2A–2G depict cross section views of a CMOS structure during the steps performed to form a tungsten plug contact in accordance with the preferred embodiment of the present invention.

Referring to FIG. 2A, there is shown a cross section view of the preferred embodiment of a CMOS structure 40 before the formation of the tungsten plug of the present invention. A typical sequence of process steps that are used to create such a CMOS structure is as follows.

A) Form N-well 60 and P-well 70 within substrate 30.

B) Form field oxide 80 outside active regions. (steps A and B can be in either order)

C) Implant ions such as boron into N-well 60 and P-well 70 to control the threshold voltage of P-channel MOS transistor 45 and N-channel MOS transistor 46, respectively.

D) Form gate oxide layer 90 and polysilicon gate layer(s) 100.

E) Mask and form gate regions, exposing source and drain regions 57. Leave gate oxide layer 90 more or less intact.

F) Mask and dope the source and drain regions 57 using boron ($BF_2$) to dope the P-channel MOS transistor 45 and arsenic to dope the N-channel MOS transistor 46. First, perform a low dose implant through the gate oxide to create lightly doped P and N diffusion ("LDD") regions 58. Second, form an oxide layer and anisotropically etch the oxide layer so as to leave sidewall spacers 55. Third, perform a high dose implant to create P+ and N+ diffusion regions 59.

G) Deposit a passivating oxide layer 110 with a thickness of 5000 angstroms over CMOS structure 40.

H) Anneal the device at a high temperature to densify the passivating oxide layer. This high temperature step also defines the depth of diffusion regions 58 and 59, which is typically approximately 0.25 micron for a 0.35 micron P-channel MOS transistor.

I) Mask and etch contact holes through passivating oxide layer 110 over diffusion regions 58 and 59.

Figure 2B:
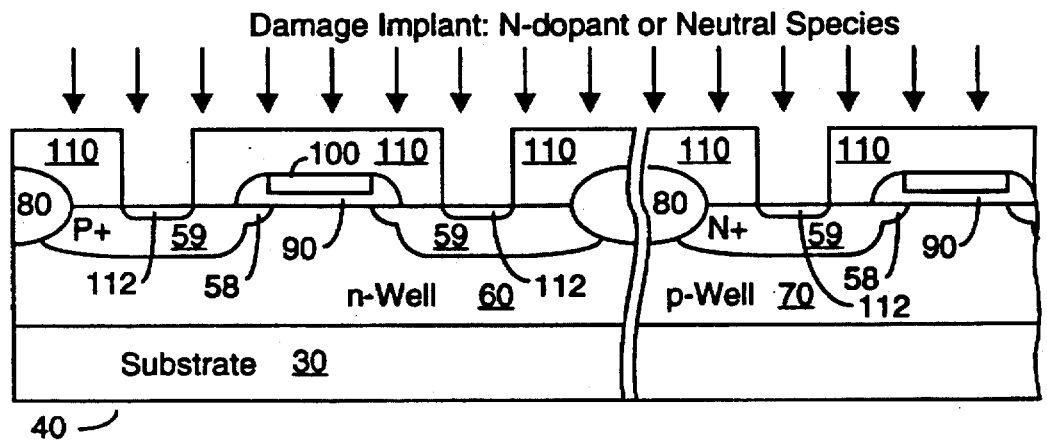

FIGS. 2B–2G illustrate the steps required for the formation of the tungsten plug in accordance with the present invention. First, as shown in FIG. 2B, a high energy, low dose of silicon, germanium or arsenic is implanted within CMOS structure 40. High implant energy is used so that the implantation step creates a region 112 with lattice damage within the P-doped diffusion region 59, producing new point defects within the lattice. These point defects cause an increase in the diffusivity of the P-dopant, which in the preferred embodiment is boron, drawing the P-dopant into the region 112 with lattice damage. This process increases the concentration of P-dopant within the region 112 with lattice damage to compensate for the P-dopant that is drawn away by the plug contact 50, thus reducing the contact resistance of the P-doped regions. As shown in FIG. 2B, the lattice damaged area 112 is near the surface of the of the P-doped diffusion region 59, and thus is positioned to increase P-doping levels at the very place where P-doping levels are reduced due to dopant migration into the overlying TiSi$_2$/TiN plug. A low dopant dose is used during this implant step to avoid negatively affecting the P-doping level in diffusion region 59.

No masking is required to perform the implantation. The entire CMOS structure 40 can be implanted since the material that is implanted is either an N-dopant or a neutral species (such as silicon or germanium), neither of which negatively affect the characteristics of N-channel MOS transistors 46. If an arsenic implant is used on the PMOS transistors, the dose is made low enough to avoid effecting the boron concentration.

Figure 2C:
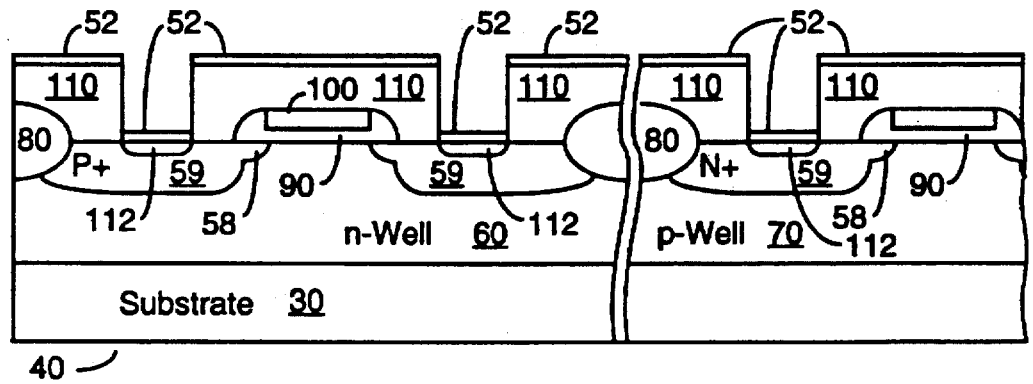

Second, as shown in FIG. 2C, a very thin layer (e.g., 700Å) of a silicide precursor 52, preferably titanium (Ti), is deposited on CMOS structure 40.

Figure 2D:
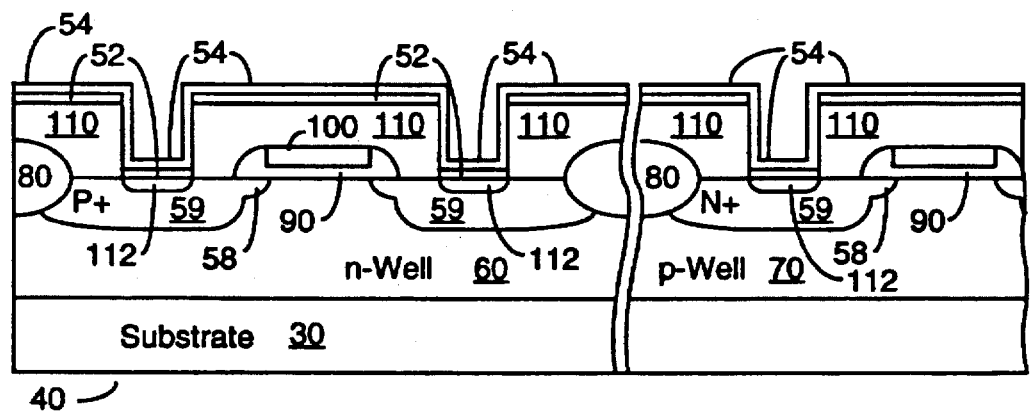

Third, as shown in FIG. 2D, a very thin layer (e.g., 500Å) of a barrier material 54, preferably titanium nitride (TiN), is deposited over silicide precursor 52.

Figure 2E:
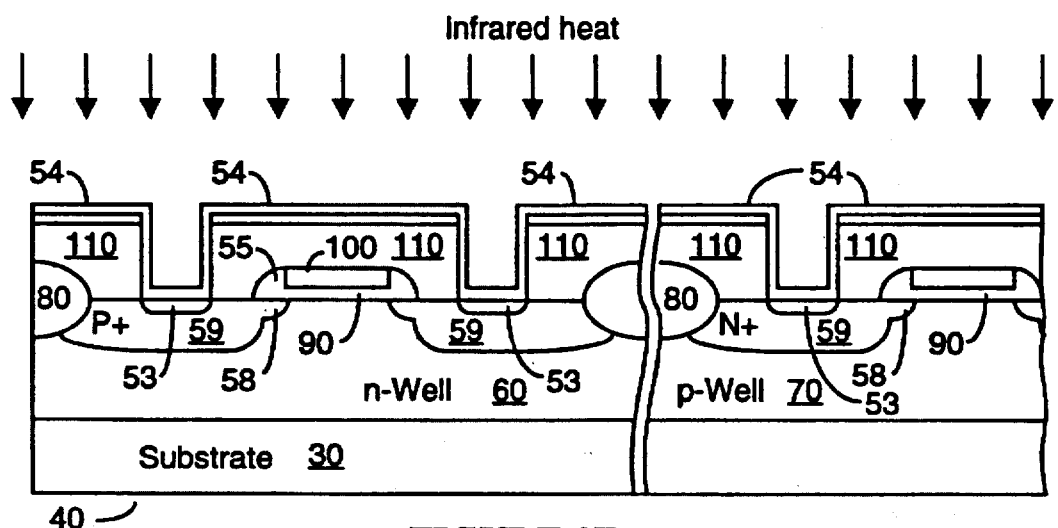

Fourth, as shown in FIG. 2E, CMOS structure 40 is processed with a rapid thermal anneal (RTA) step to react the silicide precursor layer 52 with the silicon surface of CMOS structure 40 so as to convert the silicide precursor layer 52 into a silicide layer 53, which in the preferred embodiment is titanium silicide (TiSi$_2$). The RTA step preferably utilizes infrared heat lamps, generating infrared heat to perform the annealing. This annealing step, and other subsequent short anneal steps that are used in standard CMOS semiconductor manufacturing technologies, are sufficient to cause diffusion of additional P-dopant into the lattice damaged diffusion regions 112 from the neighboring portions of the P-doped diffusion region 59, thereby reducing the resistance of the diffusion region neighboring the tungsten plug contact.

Figure 2F:
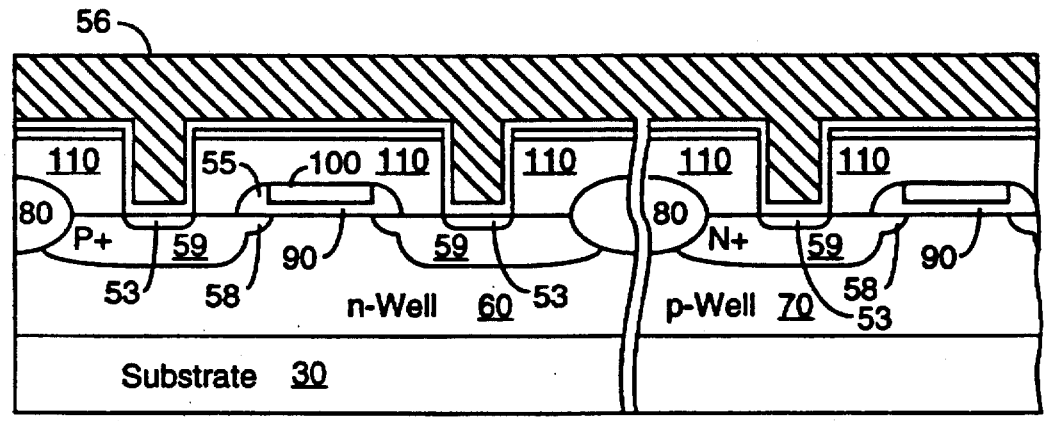

Fifth, as shown in FIG. 2F, a thick (3000Å) layer of tungsten 56 is deposited over barrier layer 54.

Figure 2G:
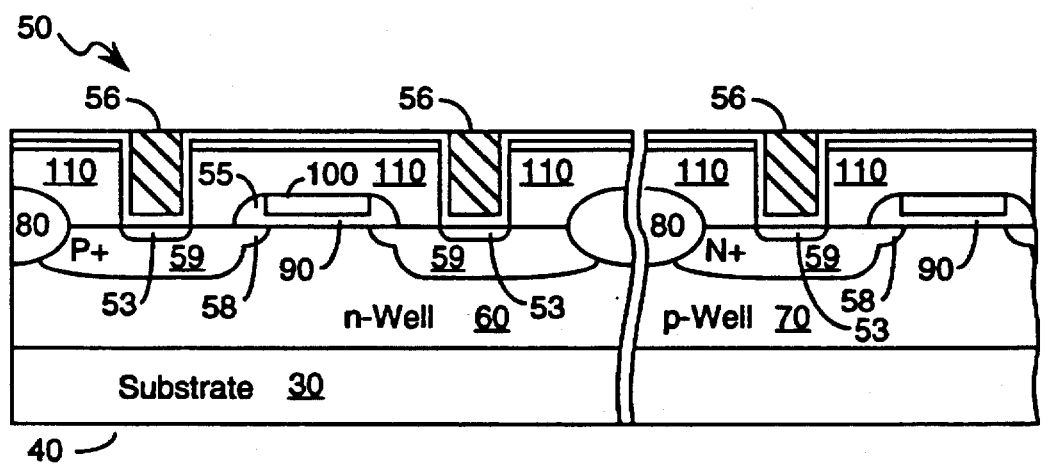

Sixth, as shown in FIG. 2G, CMOS structure 40 is etched to form the plug contacts 50. It is noted that no process steps that apply a high temperature for a significant duration occur after this step (i.e., after the completion of the tungsten plug formation steps); only short, low temperature annealing steps are performed after this step. Therefore the diffusion region doping profiles present after the tungsten formation steps are maintained through the end of the circuit manufacturing process.

As a variation of the preferred embodiment of the present invention, the implantation of the N-dopant or neutral species such as silicon or germanium may be performed immediately after, rather than before, the deposition of silicide precursor layer 52.

As another variation of the preferred embodiment, the present invention may be applied to bipolar or Bi-CMOS circuit structures, rather than MOS and CMOS circuit structures.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for reducing the contact resistance associated with tungsten plug contacts to P-doped diffusion regions of a semiconductor device, the steps of the method comprising:

(a) implanting an N-dopant or neutral species into said P-doped diffusion regions, wherein said implanting creates lattice damage within at least a portion of said P-doped diffusion regions such that diffusion of P-dopant within said portions of said P-doped diffusion regions is enhanced.

(b) depositing a first material layer over said P-doped diffusion regions;

(c) depositing a second material layer over said first material layer; and (d) depositing a tungsten layer over said second material layer to form said tungsten plug contacts.

2. The method of claim 1, wherein said implanting is performed with a high energy and low dose of N-dopant or neutral species.

3. The method of claim 1, wherein said N-dopant is arsenic.

4. The method of claim 1, wherein said neutral species is silicon or germanium.

5. The method of claim 1, wherein after step (c) said method includes the step of reacting said first material layer with said P-doped diffusion regions to form a contact material layer.

6. The method of claim 5, wherein said contact material is a silicide.

7. The method of claim 5, wherein said first material is titanium and said contact material is titanium silicide.

8. The method of claim 1, wherein said second material is a barrier metal.

9. The method of claim 8, wherein said barrier metal is titanium nitride.

10. A method for reducing the contact resistance associated with tungsten plug contacts to P-doped diffusion regions of a semiconductor device, the steps of the method comprising:

(a) depositing a first material layer over said P-doped diffusion regions;

(b) implanting an N-dopant or neutral species through said first material layer into said P-doped diffusion regions, wherein said implanting creates lattice damage within at least a portion of said P-doped diffusion regions such that diffusion of P-dopant within said portions of said P-doped diffusion regions is enhanced;

(c) depositing a second material layer over said first material layer; and (d) depositing a tungsten layer over said second material layer to form said tungsten plug contacts.

11. The method of claim 10, wherein said implanting is performed with a high energy and low dose of N-dopant or neutral species.

12. The method of claim 10, wherein said N-dopant is arsenic.

13. The method of claim 10, wherein said neutral species is silicon or germanium.

14. The method of claim 10, wherein after step (c) said method includes the step:

(c) reacting said first material layer with said P-doped diffusion regions to form a contact material layer.

15. The method of claim 14, wherein said contact material is a silicide.

16. The method of claim 14, wherein said first material is titanium and said contact material is titanium silicide.

17. The method of claim 10, wherein said second material is a barrier metal.

18. The method of claim 17, wherein said barrier metal is titanium nitride.

19. A method for reducing the contact resistance associated with multilayer tungsten plug (MTP) contacts to P-doped diffusion regions of a semiconductor device, the steps of the method comprising:

(a) implanting an N-dopant or neutral species into said P-doped diffusion regions, wherein said implanting creates lattice damage within at least a portion of said P-doped diffusion regions such that diffusion of P-dopant within said portions of said P-doped diffusion regions is enhanced; and (b) forming all layers of said MTP contacts on said P-doped diffusion regions.

20. The method of claim 19, wherein said step (b) includes the steps:

(b1) depositing a first material layer over said P-doped diffusion regions;

(b2) depositing a second material layer over said first material layer;

(b3) reacting said first material layer with said P-doped diffusion regions to form a contact material layer; and (b4) depositing a tungsten layer over said second material layer.

21. A method for reducing the contact resistance associated with multilayer tungsten plug (MTP) contacts to P-doped diffusion regions of a semiconductor device, the steps of the method comprising:

(a) forming at least a first material layer of said MTP contacts on said P-doped diffusion regions, wherein said implanting creates lattice damage within at least a portion of said P-doped diffusion regions such that diffusion of P-dopant within said portions of said P-doped diffusion regions is enhanced;

(b) implanting an N-dopant or neutral species into said P-doped diffusion regions; and (c) forming all remaining layers of said MTP contacts on said P-doped diffusion regions.

22. The method of claim 21, wherein:

said step (a) includes depositing said first material layer over said P-doped diffusion regions; and said step (c) includes the steps:

(c1) depositing a second material layer over said first layer;

(c2) reacting said first material layer with said P-doped diffusion regions to form a contact layer; and (c3) depositing a tungsten layer over said second material layer.

* * * * *